(12) United States Patent
Leung et al.

(10) Patent No.: US 6,974,653 B2
(45) Date of Patent: Dec. 13, 2005

(54) METHODS FOR CRITICAL DIMENSION AND FOCUS MAPPING USING CRITICAL DIMENSION TEST MARKS

(75) Inventors: Frank C. Leung, San Jose, CA (US); Etsuya Morita, Dublin, CA (US); Christopher Howard Putnam, Pleasanton, CA (US); Holly H. Magoon, Colchester, VT (US); Ronald A. Pierce, Richmond, VT (US); Norman E. Roberts, Richmond, VT (US)

(73) Assignee: Nikon Precision Inc., Belmont, CA (US)

( * ) Notice: Subject to any disclaimer, the term of this patent is extended or adjusted under 35 U.S.C. 154(b) by 160 days.

(21) Appl. No.: 10/310,640

(22) Filed: Dec. 4, 2002

(65) Prior Publication Data

US 2003/0211700 A1    Nov. 13, 2003

Related U.S. Application Data

(60) Provisional application No. 60/373,850, filed on Apr. 19, 2002.

(51) Int. Cl.⁷ .............................................. G03F 9/00
(52) U.S. Cl. .................... 430/30; 430/311; 382/144; 382/145; 382/148; 438/14; 438/401
(58) Field of Search .................. 430/30, 311; 382/144, 382/145, 148; 438/14, 401

(56) References Cited

U.S. PATENT DOCUMENTS

| | | |
|---|---|---|
| 4,396,849 A | 8/1983 | Taiani |
| 4,433,911 A | 2/1984 | Sawada et al. |
| 4,521,686 A | 6/1985 | Coates et al. |
| 4,549,084 A | 10/1985 | Markle |
| 4,585,342 A | 4/1986 | Lin et al. |
| 4,677,301 A | 6/1987 | Tanimoto et al. |
| 4,744,662 A | 5/1988 | Suto et al. |
| 4,759,626 A | 7/1988 | Kroko |
| 4,772,119 A | 9/1988 | Bouwhuis et al. |
| 4,774,158 A | 9/1988 | Vervoordeldonk et al. |
| 4,803,524 A | 2/1989 | Ohno et al. |
| 4,908,656 A | 3/1990 | Suwa et al. |
| 4,959,326 A | 9/1990 | Roman et al. |
| 5,044,750 A | 9/1991 | Shamble |
| 5,049,925 A | 9/1991 | Aiton et al. |
| 5,111,240 A | 5/1992 | Boettiger et al. |
| 5,140,366 A | 8/1992 | Shiozawa et al. |
| 5,247,329 A | 9/1993 | Oshida et al. |
| 5,262,822 A | 11/1993 | Kosugi et al. |
| 5,300,786 A | 4/1994 | Brunner et al. |
| 5,362,585 A | 11/1994 | Adams |
| 5,408,083 A | 4/1995 | Hirukawa et al. |
| 5,440,138 A | 8/1995 | Nishi |
| 5,450,205 A | 9/1995 | Sawin et al. |
| 5,508,803 A | 4/1996 | Hibbs et al. |
| 5,573,634 A | 11/1996 | Ham |
| 5,615,006 A | 3/1997 | Hirukawa et al. |
| 5,656,403 A | 8/1997 | Shieh |
| 5,666,205 A | 9/1997 | Tateno et al. |
| 5,686,223 A | 11/1997 | Cleeves |
| 5,702,868 A | 12/1997 | Kellam et al. |
| 5,747,202 A | 5/1998 | Tanaka |
| 5,776,645 A | 7/1998 | Barr et al. |
| 5,789,734 A | 8/1998 | Torigoe et al. |
| 5,808,731 A | 9/1998 | Kirk |
| 5,914,784 A | 6/1999 | Ausschnitt et al. |
| 5,953,128 A | 9/1999 | Ausschnitt et al. |
| 5,965,309 A | 10/1999 | Ausschnitt et al. |
| 5,968,693 A | 10/1999 | Adams |
| 5,973,773 A | 10/1999 | Kobayashi |
| 5,976,740 A | 11/1999 | Ausschnitt et al. |
| 5,981,119 A | 11/1999 | Adams |
| 5,985,495 A | 11/1999 | Okumura et al. |
| 5,985,498 A | 11/1999 | Levinson et al. |
| 5,989,764 A | 11/1999 | Adams |
| 5,991,006 A | 11/1999 | Tsudaka |

(Continued)

FOREIGN PATENT DOCUMENTS

EP        502583 A1    9/1992

(Continued)

OTHER PUBLICATIONS

Arnold et al., "A focus vernier for optical lithography", (1993) SPIE vol. 1926, pp. 380-392.

(Continued)

Primary Examiner—Christopher G. Young
(74) Attorney, Agent, or Firm—Beyer Weaver & Thomas, LLP

(57) ABSTRACT

Methods for using critical dimension test marks (test marks) for the rapid determination of the best focus position of lithographic processing equipment and critical dimension measurement analysis across a wafer's surface are described. In a first embodiment, a plurality of test mark arrays are distributed across the surface of a wafer, a different plurality being created at a plurality of focus positions. Measurement of the length or area of the resultant test marks allows for the determination of the best focus position of the processing equipment. Critical dimension measurements at multiple points on a wafer with test marks allow for the determination of process accuracy and repeatability and further allows for the real-time detection of process degradation. Using test marks which require only a relatively simple optical scanner and sensor to measure their length or area, it is possible to measure hundreds of measurement values across a wafer in thirty minutes. Comparable measurements with a Scanning Electron Microscope (SEM) require at least five hours.

30 Claims, 5 Drawing Sheets

U.S. PATENT DOCUMENTS

| | | | |
|---|---|---|---|
| 6,004,706 | A | 12/1999 | Ausschnitt et al. |
| 6,057,908 | A | 5/2000 | Ota |
| 6,063,531 | A * | 5/2000 | Singh et al. .................. 430/30 |
| 6,088,113 | A | 7/2000 | Kim |
| 6,094,256 | A | 7/2000 | Grodnensky et al. |
| 6,128,089 | A | 10/2000 | Ausschnitt et al. |
| 6,130,750 | A | 10/2000 | Ausschnitt et al. |
| 6,137,578 | A | 10/2000 | Ausschnitt |
| 6,166,801 | A | 12/2000 | Dishon et al. |
| 6,226,074 | B1 | 5/2001 | Fujisawa et al. |
| 6,296,977 | B1 | 10/2001 | Kaise et al. |
| 6,317,211 | B1 | 11/2001 | Ausschnitt et al. |
| 6,323,938 | B1 | 11/2001 | Grodnensky et al. |
| 6,323,945 | B1 | 11/2001 | Saito |
| 6,338,926 | B1 * | 1/2002 | Ku et al. ...................... 430/30 |
| 2002/0177057 | A1 | 11/2002 | Grodnensky |
| 2002/0180990 | A1 | 12/2002 | Grodnensky et al. |

FOREIGN PATENT DOCUMENTS

| | | |
|---|---|---|
| EP | 4-324615 | 11/1992 |
| EP | 973068 A2 | 1/2000 |
| EP | 992855 A1 | 4/2000 |
| EP | 1065567 A2 | 1/2001 |
| EP | 1128217 A2 | 8/2001 |
| EP | 1160626 A1 | 12/2001 |
| JP | 62-115830 | 5/1987 |
| JP | 62-247525 | 10/1987 |
| JP | 1-187817 | 7/1989 |
| JP | 2-30112 | 1/1990 |
| JP | 2-31142 | 2/1990 |
| JP | 4-209518 | 7/1992 |
| JP | 5-62882 | 3/1993 |
| JP | 5-129238 | 5/1993 |
| JP | 5-217872 | 8/1993 |
| WO | WO 92/11609 | 7/1992 |
| WO | WO 01/84382 A1 | 11/2001 |

OTHER PUBLICATIONS

Brunner et al., "A Stepper Image Monitor for Precise Setup and Characterization", (1988) SPIE vol. 922, Optical/Laser Microlithography, pp. 366-375.

Liu et al., "The Application of Alternating Phase-shifting Masks to 140 nm Gate Patterning (II): Mask Design and Manufacturing Tolerances", (1998) SPIE vol. 3334, pp. 2-14.

Kirk, "Astigmatism and field curvature from pin-bars", (1991) SPIE vol. 1463 Optical/Laser Microlithography IV, pp. 282-291.

Schneider et al., "Automated Photolithography Critical Dimension Controls In A Complex, Mixed Technology, Manufacturing Fab", (2001) IEEE/SEMI Adv. Semi. Mfging. Conf., pp. 33-40.

Ronse et al., "CD Control Comparison of Step & Repeat versus Step & Scan DUV Lithography for sub-0.25 $\mu$m gate printing", (1998) SPIE vol. 3334, pp. 58-66.

Wong et al., "Characterization of line width variation", (2000) SPIE vol. 4000, pp. 184-191.

Zavecz et al., "Critical Dimension Uniformity Prediction And A Method Of Discrimination Between Exposure Tool And Process Induced Variation Using Empirical Focal Plane Modeling", (1997) TEA Sys. Corp., pp. 155-161.

Ferguson et al., "Data analysis methods for evaluating lithographic performance", (1997) J. Vac. Sci. Technol. B 15(6), pp. 2387-2393.

Sohail et al., "Diffractive techniques for lithographic process monitoring and control", (1994) J. Vac. Sci. Technol. B 12(6), pp. 3600-3606.

Starikov, "Exposure Monitor Structure", (1990) SPIE vol. 1261, Integrated Circuit Metrology, Inspection, and Process Control IV, pp. 315-324.

Rosner et al., "Fourier Analysis Determination of Best Focus in Sub-micron Lithography", (1994) SPIE vol. 2196, pp. 314-320.

Brunner, "Impact of lens aberrations on optical lithography", (1997) IBM J. Res. Develop., vol. 41, No. 1/2, pp. 57-67.

Brunner et al., "*In Situ* Resolution and Overlay Measurement on a Stepper", (1985) SPIE vol. 565 Micron and Submicron Integrated Circuit Metrology, pp. 6-13.

Singh et al., "Linewidth Measurement by Low Voltage SEM", (1988) SPIE vol. 921, Integrated Circuit Metrology, Inspection, and Process Control II, pp. 16-21.

Milner et al., "Lithography process monitor using light diffracted from a latent image", (1993) SPIE vol. 1926, pp. 94-105.

Kirk, "Measurement of astigmatism in microlithography lenses", (1998) SPIE vol. 3334, pp. 848-854.

Kirk et al., "Measurement of microlithography aerial image quality", (1996) SPIE vol. 2726, pp. 410-416.

Murray, "Measuring dimensions Using Murray Daggers", (Dec. 1982) Semiconductor Int'l , pp. 70-73.

Kirk, "Measuring the aerial image with an atomic force microscope", (1997) Microlithography World, pp. 4-9.

Brunner, "New Focus Metrology Technique Using Special Test Mask", (1994) Microlithography World, pp. 5-13.

Finders et al., "Optimizing $i$-line lithography for 0.3-$\mu$m poly-gate manufacturing", (Mar. 1997) Solid State Technology, 11 pp.

Wheeler et al., "Phase Shift Focus Monitor Applications To Lithography Tool Control", (1997) SPIE vol. 3051, pp. 225-233.

Autschnitt et al., "Process window metrology", (2000) SPIE vol. 3998, pp. 158-166.

Brunner et al., "Quantitative stepper metrology using the focus monitor test mask", (1994) SPIE vol. 2197, pp. 541-549.

Ausschnitt, "Rapid Optimization of the Lithographic Process Window", (1989) SPIE vol. 1088, Optical/Laser Microlithography II, pp. 115-123.

Kirk, "Review of photoresist based lens evaluation methods", (2000) SPIE vol. 4000, pp. 2-8.

Putnam et al., "Scanner Focus and CD Response Characterization Metrology For Sub 180 nm Lithography", (Date & Publisher unknown), Nikon Precision Inc., 9 pp.

Kivenzor, "Self-Sustaining Dose Control System: Ways to Improve the Exposure Process", (2000) SPIE vol. 4000, Optical Microlithography XIII, pp. 835-842.

Brunner, "Simulations and experiments with the phase shift focus monitor", (1996) SPIE vol. 2726, pp. 236-243.

Tan et al., "SMART SET™—An Integrated Approach to Stepper Set-Up and Calibration", (1985) SPIE vol. 565 Micron and Submicron Integrated Circuit Metrology, pp. 45-55.

Wilder et al., "Sub-0.35-micron critical dimension metrology using atomic force microscopy", (1996) SPIE vol. 2725, pp. 540-554.

Grodnensky et al., "Technique for optical characterization of exposure tool imaging performance down to 100 nm", (1999) J.Vac.Sci.Technol. B 17(6), pp. 3285-3290.

Arnold, "Thinking small: challenges for metrology at century's end", (1997) SPIE vol. 3050, pp. 2-9.

Progler et al., "Understanding The Effect Of Pitch on Linewidth Control", (1996) Olin Microelectronic Materials, Olin Microlithography Seminar, pp. 141-157.

Martin et al., "Using the focus monitor test mask to characterize lithographic performance", (1995) SPIE vol. 2440, pp. 657-666.

Monahan et al., "Yield Impact of Cross-Field and Cross-Wafer CD Spatial Uniformity: Collapse of the Deep-UV and 193nm Lithographic Focus Window", (1999) IEEE, pp. 115-118.

IBM Technical Disclosure Bulletin, "Multilayer Circuit Fabrication using Double Exposure of Positive Resist", Oct. 1993, IBM Corp., vol. 36, No. 10, pp. 423-424.

* cited by examiner

Samples 5 rows x 3 columns points per field

Samples 5 rows x 3 columns points per field

FIG. 3

|  | SMP Test Results | MX-SMP Test Results |
|---|---|---|
| Focus Determination | | |
| Average 3 sigma (um) | 0.021 | 0.009 |
| Worst 3 sigma (um) | 0.035 | 0.027 |
| Best 3 sigma (um) | 0.008 | 0.004 |
| Leveling Determination | | |
| Average 3 sigma (urad) | 1.396 | 0.849 |
| Worst 3 sigma (urad) | 2.634 | 0.991 |
| Best 3 sigma (urad) | 0.361 | 0.706 |

FIG. 4

| +<br>A | -<br>B | -<br>C | +<br>D | Alt<br>E | Alt<br>F | Alt<br>G | -<br>H | +<br>I | -<br>J | +<br>K | Alt<br>L | Alt<br>M | Alt<br>N | Alt<br>O |
|---|---|---|---|---|---|---|---|---|---|---|---|---|---|---|
| 114 | 122 | 49 | 4 | -74 | 29 |  | 93 | 91 |  |  | 49 | 64 | 10 | 101 |
| -66 | 73 | 2 | -7 | 125 | 31 | -20 | 57 | -56 |  |  | 33 | 20 | -6 | -39 |
| 51 | -13 | 90 | 37 |  | 1 | -82 | 190 | 18 |  |  | -5 | 14 | -26 | 68 |
| 132 | 9 | -16 | 65 | -89 | 83 | -7 | 54 | 44 |  | 104 | -37 | 51 | -44 | 121 |
| 76 | -26 | -8 | -80 | 15 | -38 |  | -45 | -65 | 19 | -1 | -8 | -65 | -37 | -17 |
| 72 | -14 | 53 | 43 |  | 12 | -130 | -55 | 61 | 26 | 65 | 41 | -17 | 15 | 37 |
| 22 | 63 | -20 | 53 | -60 | 56 | -8 | 45 | 112 | -4 | 32 | 77 | 70 | 7 | 151 |
| -82 | -32 | -1 | 27 | 56 | -56 | -85 | -43 | 6 | 47 | 66 | -11 | -33 | -27 | -13 |
| -115 | 24 | 30 | 60 |  | 66 |  | -28 | 105 | 73 | 96 | 106 | -14 | -75 | 22 |
|  |  | 71 | 73 | -49 | 36 | -12 | 57 | 40 | 85 | 38 | 45 | 46 | 8 | 158 |
|  |  | -5 | -51 | 119 | -20 | -26 | -9 | 85 | -28 | 67 | 40 | -10 | 53 | 1 |
|  |  | -18 | 63 |  | 22 |  | 50 | 78 | 5 | 71 | 101 | 73 | 22 | 59 |
|  |  | 47 | 37 | -38 | 22 | 28 | 69 | 55 | -24 |  | 82 | 43 | 31 | -8 |
|  |  | 81 | 60 | 104 | 34 |  | -61 | -11 |  |  | 94 | -20 | -24 | 82 |
|  |  | -59 | 41 |  | 75 | 57 | 96 | 50 |  |  | 51 | 38 | 72 | 45 |

| Focus Budget Item | Average TFD error | Wafer to wafer Variability of bin Range 3Sigma | |
|---|---|---|---|
| Edge Shot ON | 0.040 | 0.081 | 0.042 |
| Edge Shot OFF | 0.024 | 0.058 | 0.032 |
| Plus vs Minus | 0.069 | 0.056 | 0.029 |
| Within Wafer (X tilt) | 0.067 | 0.041 | 0.068 |
| Within Shot (X tilt) | 0.059 | 0.031 | 0.016 |
| Within Wafer (Z average) | 0.041 | 0.013 | 0.019 |
| Within Shot (Z tracking) | 0.088 | 0.041 | 0.068 |
| Curvature | 0.008 | 0.020 | 0.033 |
| Total | 0.397 | 0.341 | 0.308 |
| Average TFD of 3 wafers | 0.298 | 0.028 | 0.045 |

| Non Edge | Pre | Post | ACLV Comparison | Pre | Post |
|---|---|---|---|---|---|
| Average 3sigma X | 0.303 | 0.325 | Non Edge field in OCD um | | |
| Average 3sigma Y | 0.263 | 0.260 | X | 0.384 | 0.248 |
| | | | Y | 0.410 | 0.291 |
| Plus Only 3 sigma X | 0.353 | 0.392 | Cross Wafer in OCD um (X and Y comb) | | |
| Minus only 3 sigma X | 0.492 | 0.327 | Range from averaged fields/wafers | | |
| Plus only 3 sigma Y | 0.441 | 0.421 | All die | 0.887 | 0.842 |
| Minus only 3 sigma Y | 0.427 | 0.338 | Non Edge only | 0.239 | 0.150 |
| | | | Edge only | 0.887 | 0.278 |
| Edge | | | | | |
| X Data | | | Average from averaged fields/wafers | | |
| Overall 3 sigma average | 0.430 | 0.409 | All die | 6.517 | 6.318 |
| scan off 3sigma average | 0.381 | 0.300 | Non Edge only | 6.597 | 6.675 |
| scan on 3 sigma average | 0.576 | 0.527 | Edge only | 6.456 | 6.051 |
| | | | | | |
| Y Data | | | | | |
| Overall 3 sigma average | 0.422 | 0.406 | | | |
| scan off 3sigma average | 0.389 | 0.316 | | | |
| scan on 3 sigma average | 0.513 | 0.480 | | | |

*FIG. 7*

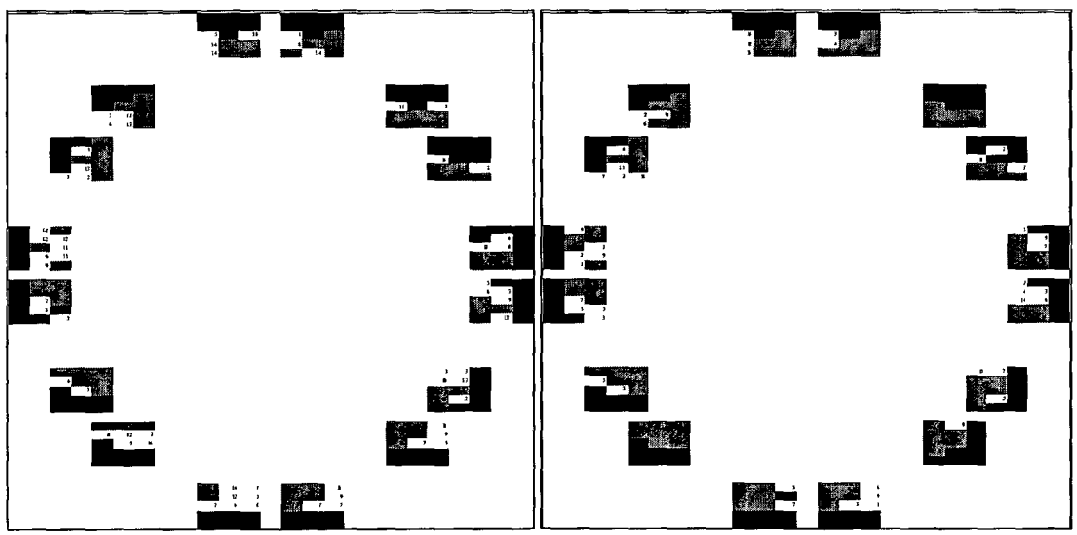

*FIG. 8*

METHODS FOR CRITICAL DIMENSION AND FOCUS MAPPING USING CRITICAL DIMENSION TEST MARKS

CROSS REFERENCE TO RELATED APPLICATION

This application claims priority of provisional application No. 60/373,850, filed Apr. 19, 2002 which is incorporated herein by reference in its entirety.

BACKGROUND OF THE INVENTION

1. Field of the Invention

The present invention relates generally to the measurement of focus variations and/or critical dimension in lithographic processes.

2. Description of the Related Art

A lithographic process generally includes the exposure of a resist in a pattern with some form of energy (e.g. light, charged particles, x-rays, etc.) to which the resist is sensitive. The resist is subsequently developed to remove selected areas of the resist thereby leaving portions of the underlying layer exposed to allow processes to be selectively carried out on the exposed portions of the underlying layer. In the manufacture of integrated circuits (ICs), at least one lithographic process is generally required for the formation of any active or passive electrical element in order to define its location and its basic dimensions.

Developments in lithography have resulted in the size of features on finished ICs now being less than 0.25 microns ($\mu$m). By way of example, some current state of the art technologies incorporate 0.18 $\mu$m line width design rules. The industry is currently developing devices implementing next generation design rules (e.g., 0.13 $\mu$m, 0.08 $\mu$m etc.) and it is fully expected that in the coming years these dimensions will be further reduced.

To achieve features of these and smaller dimensions, process layers have to be manufactured with a minimum depth of focus with very stringent critical dimension control. Depth of focus is defined herein as the maximum allowable focus variation to maintain critical dimension tolerance within the finished IC. By way of example, a permissibly depth of focus of only 0.3 $\mu$m or less will be required in many processes. This extremely small depth of focus requires optimum focus control on all exposure fields on the wafer, whether they are exposed in the center of the wafer or at its edge. The effective error budget for all elements that contribute to the focus must be kept to an absolute minimum, as the total error budget of the depth of focus is the sum of all lens and body effects on the focus.

Wafer processing within these constraints is extremely challenging. The ability to measure and quantify focus and critical dimension variations throughout the production environment is important to understanding which elements contribute to degrading the focus.

The semiconductor processing equipment industry has relied heavily on Scanning Electron Microscopes (SEMs) to measure and evaluate critical dimensions on a wafer. Unfortunately, SEM measurement is a time consuming process and requires a highly skilled operator to obtain the requisite levels of accuracy. As the complexity of lithographic equipment increases and product specifications become ever more rigorous, the volume of the SEM measurements necessary to characterize a wafer has become burdensome. Accordingly, improved methods for measuring depth of focus and/or critical dimension variations across a semiconductor wafer either in testing or in the production environment that are much faster than using an SEM and at least as accurate would be desirable.

SUMMARY OF THE INVENTION

The present invention relates generally to methods for measuring and evaluating the focus performance of lithographic equipment and/or the critical dimension response across a wafer using optical measurement techniques. To facilitate the measurements, a defined test mark pattern is lithographically formed in a resist layer formed on a wafer. The test mark pattern is composed of a number of test marks that are distributed at strategic locations across the surface of a wafer. The test marks are then optically measured to facilitate the evaluation of focus performance and/or the critical dimension response across the wafer. The test marks are preferably sized such that they are closely related to a critical dimension of interest.

The described arrangements permits significantly faster analysis of a wafer than is possible using conventional SEM based measurements. The same technology permits assessment of the same performance characteristics over many wafers, which facilitates trend analysis and other related measures of operational performance.

One embodiment of the present invention contemplates the creation of a "map" for strategically placing test marks on a wafer together with a description of the scan direction used to create each test mark. Test marks are generally provided at several locations on the periphery of the wafer as well as at several specific interior locations of the wafer. Values derived from the plurality of test marks placed on the wafer and measured in both the X and Y directions are used to optimize the focus of the lithographic machines used in the production of ICs.

The described embodiments permit a test structure map of test marks to be used to characterize the across wafer best focus setting and to determine, by analysis of the measured size or area of the test marks, those factors that contribute to causing focus deviations. The described methods may also be used to measure specific critical dimensions as well as the variation of critical dimensions across the surface of the wafer. Measuring variations across a wafer generates data for a uniformity map. The measurements and/or the uniformity map may be used to determine a wide variety of critical dimension characteristics that can be used to evaluate the wafers and the performance of the equipment used to image the patterns on the wafers. For example, critical dimension variations from wafer to wafer, critical dimension variations from the interior to the edge of a wafer generally or along specific scan lines, critical dimension variations at the edge of a wafer and critical dimension variations for plus and minus scans may all be evaluated. The uniformity map provides data to determine the imaging capability of a lithography system at the edge of the wafer.

BRIEF DESCRIPTION OF THE DRAWINGS

The present invention may be better understood by referencing the accompanying drawings. For simplicity, common numbering of elements within the illustrations is employed where an element is the same in different drawings.

FIG. 3 is a chart showing comparative results of focus analysis using the present invention and SMP;

FIG. 4 is a chart of data obtained using the present invention for a through focus test;

FIG. 7 is a chart of the present invention's critical dimension test for pre- and post-focus modification; and FIG. 8 shows pre- and post-modification testing results using the present invention.

DETAILED DESCRIPTION OF THE PREFERRED EMBODIMENTS

Figure 1:
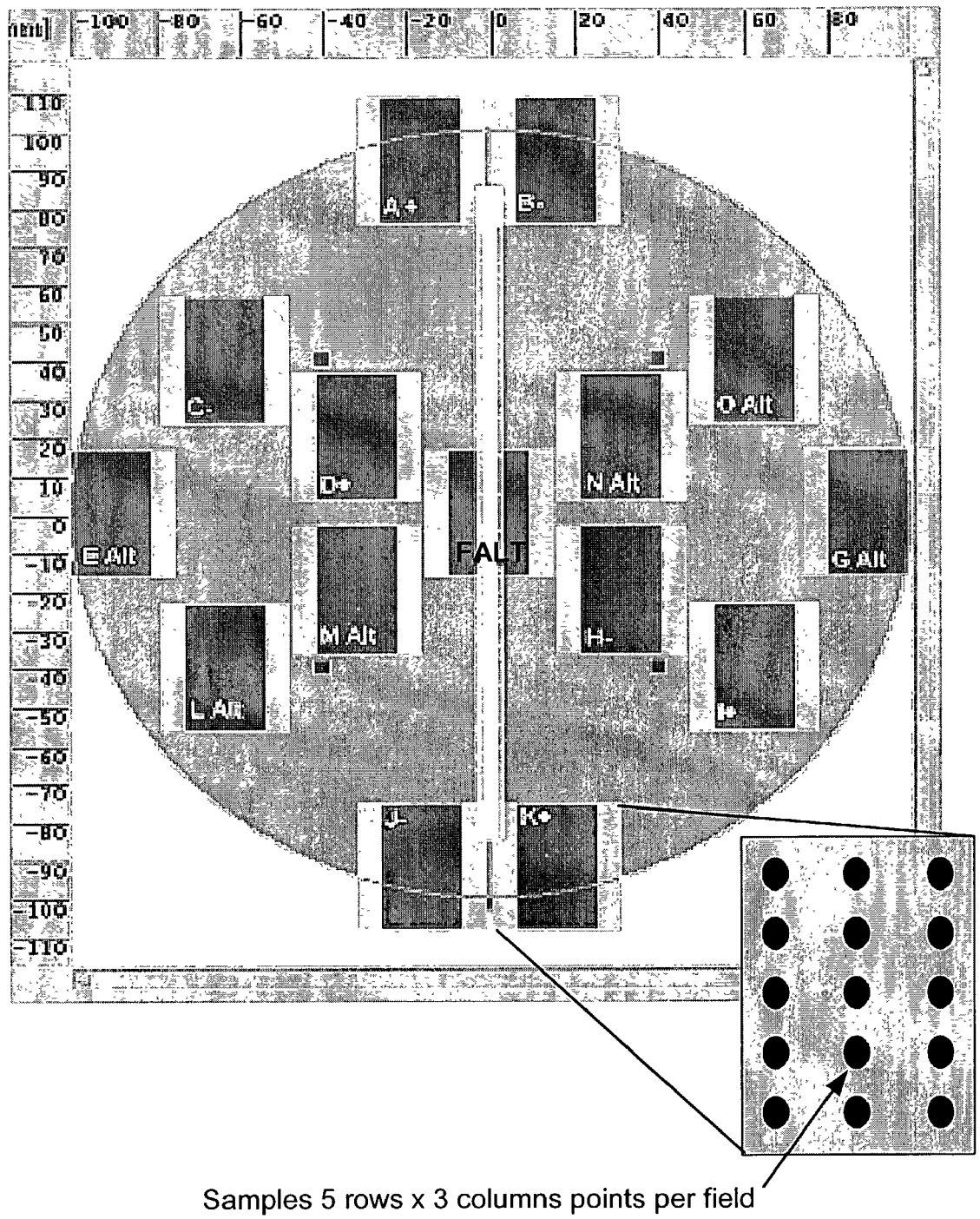
FIG. 1 is a map of a wafer showing the areas where test marks are created and imaged in a first embodiment of the present invention.

The present invention relates generally to methods for measuring and evaluating the focus performance of lithographic equipment and/or the critical dimension response across a wafer using optical measurement techniques. To facilitate the measurements, a defined test pattern of test mark is lithographically formed in a resist layer formed on a wafer. The test pattern is composed of a number of test marks that are distributed at strategic locations across the surface of a wafer. The test marks are then optically measured to facilitate the evaluation of focus performance and/or the critical dimension response across the wafer. The test marks are preferably sized such that they are closely related to a critical dimension of interest.

In order to evaluate best focus, the test pattern is composed of a number of test fields. Each test field has a series of test marks that are formed by stepping through a sequence of different focus settings in small increments. The test marks are then optically measured (typically by measuring a geometric parameter such as length or area of each mark). The best focus position within each test field will typically be the focus setting corresponding to the largest measured mark.

The invention described below may be used in conjunction with a variety of different test marks and mark measurement techniques. However, the presently preferred test mark geometry and measurement techniques are described in U.S. Pat. No. 6,094,256 (the '256 patent), U.S. patent application Ser. No. 09/861,541, filed 22 May 2001 and U.S. patent application Ser. No. 10/165,733, filed 7 Jun. 2002, entitled "Measurement of Critical Dimensions of Etched Features," which is a continuation-in-part of the previously referenced application. Each of these patents and patent applications are incorporated herein by reference in their entirety for all purposes.

The referenced patent and patent applications generally teach the formation and measurement of test marks having a length much larger than a critical dimension of interest in order to provide an indirect measurement of the critical dimension of interest. The test marks are defined during lithography by taking overlapping partial lithographic exposures of one or more test line patterns. The line widths are preferably chosen to match a critical dimension of interest. The overlapping exposures are made with the test line patterns displaced through a small angle between partial exposures. When two angularly displaced overlapping partial exposures are made, this technique theoretically causes the formation of a small parallelogram or rhombus shaped test mark (often referred to as diamond shaped hereinafter). Both the major dimension of the test mark (i.e., the length between the two most widely separated points) and the area of the test mark are geometrically related to the critical dimension, by the offset angle between the partial exposures. Accordingly, the critical dimension of the test mark can be inferred by measuring either the length or the area of the test marks.

A substantially diamond shaped test mark can be defined in a resist by overlapping two angularly offset lithographic lines. The lines preferably have widths equal to the critical dimensions of interest, although their width could be varied in a known way from the critical dimension. These line features may be either effectively transparent or opaque in the reticle used for their formation, depending on whether a positive or negative imaging response is utilized. The non-linearity of modern resists tends to enhance and simplify the formation of the diamond shaped test marks. For example, many positive resists (i.e., resists wherein an exposed area becomes soluble), have non-linear activation profiles so that a half exposure by the lithography tool is sufficient to cause activation of the resist. Therefore, when a first line is exposed at a partial exposure, everything outside the exposed line becomes substantially soluble. The second line is positioned to overlap the first line but to be angularly offset from the overlapped first line by a small angle. The second line is also partially exposed which causes the activation of the portion of the first line that lies outside of the diamond shaped overlapping region of the lines. Therefore, after the resist is developed and rinsed, only the diamond shaped test marks (and other desired features) remain. Of course, the appropriate exposure doses to accomplish the desired effect may be widely varied and will depend in great part on the nature of the resist being used. In some situations, the use of full exposure doses may be appropriate.

The offset angle between the overlapping lines may be widely varied. By way of example, angular offsets in the range of 0.2 to 10 degrees are believed to work well in particular applications, although the specific angle used is typically not critical to the successful practice of the invention. In general, offset angle is preferably chosen to be as small as possible consistent with avoiding a significant degree of instability of the tips of the test mark to be generated.

As suggested above, the length and area of the diamond shaped mark are both related to the critical dimension of interest. Therefore, the length or area of the mark can be optically measured to infer the critical dimension of interest. The '256 patent describes measuring the length of the test mark to infer the critical dimension of interest. The length may be measured using a Laser Step Alignment (LSA) sensor or other suitable tool. The '541 application describes measuring the area of the mark to infer the critical dimension of interest. The area may be effectively measured using a CCD camera or other suitable imaging tool. The '733 application generally applies the same principles to the measurement of critical dimensions of etched features in integrated circuit devices.

In an aspect of the present invention related to the evaluation of best focus, a defined test pattern is created that has a number of fields of the test marks distributed at strategic locations across the surface of a wafer. Each test field has a series of test marks that are formed by stepping through a sequence of different focus settings in small increments. The test marks are then optically measured to determine the best focus position within each test field. The best focus is generally defined as the focus setting corresponding to the largest measured mark.

Referring to FIG. 1, a test pattern particularly well adapted for use in determining best focus will be described. The test marks are used to characterize the across wafer focus variation and determine the various contributors causing focus deviation. A test mark wafer distribution and layout that would evaluate such potential focus detractor components as edge wafer focus, focus variation due to plus or minus wafer scanning and across wafer focus variations is chosen. That distribution and layout map and the resultant pattern of test marks is shown in FIG. 1. The pattern of test marks distributed across the wafer shown in FIG. 1 comprises one embodiment of the present invention. The illustrated embodiment uses a 0.175 $\mu$m test mark and fifteen measurement points within each exposure field. As each test mark array requires two separate passes to create, the effective number of data points generated by each array is effectively doubled. Each field is an array, micro-stepped through a plurality of focus positions, allowing for the determination of best focus at that point on the wafer. After the test marks are imaged unto the wafer at different focus settings, the sensor system scans the imaged test marks at each of the focus steps. The measured length of the test marks' major axis changes with the focus variations, the longest measured length indicating the best focus. Similarly, if area measurement is being used, the total area measured increases to a maximum when the best focus is reached.

In FIG. 1, the labels, "+/−/alt," denote the scan direction of that particular field or, in the case of "alt," the scan direction alternates from focus step to step. As shown in FIG. 1, the series labeled A, B, E, G, J and K are edge shots and the series labeled C, D, F, H, I, L, M, N, and O are non-edge shots. Series A, D, I and K are plus direction scans and series B, C, H and J are minus direction scans. Series E, L, M, N, O and G are normal (+/−) scans. Series A and J are scan ON shots and series B and K are scan OFF shots. Each field, as shown in the insert to FIG. 1, is comprised of a 5 by 3 matrix of test marks. In this embodiment, 15 fields with 15 test marks each provide 225 test points at each focus interval. Note that each test mark required two separate exposures to create, which effectively doubles the number of focus points for which data is being obtained.

An important factor with respect to wafer edge focusing is the direction in which it is scanned on that particular area of the wafer. There are two possible scenarios, one in which the auto focus system of the scanner is on the wafer when exposure begins and then turns off once the beam has passed off the edge of the wafer. This scenario is called the Edge OFF. The other scenario is that the auto-focusing system is off and exposure scanning starts off the wafer. When the auto-focusing beam then hits the wafer, active focusing begins. This scenario is called Edge ON. For fundamental physical reasons, the Edge ON condition should have worse focus response than the Edge OFF. As the scanner has two possible scan directions (+/−), the scan direction that is either on or off the wafer depends upon the location of the wafer. As the focus determination is done by exposing the test marks through focus, this testing includes three types of fields: plus only, minus only and those exposed by alternating (Alt) scan directions.

Figure 2:
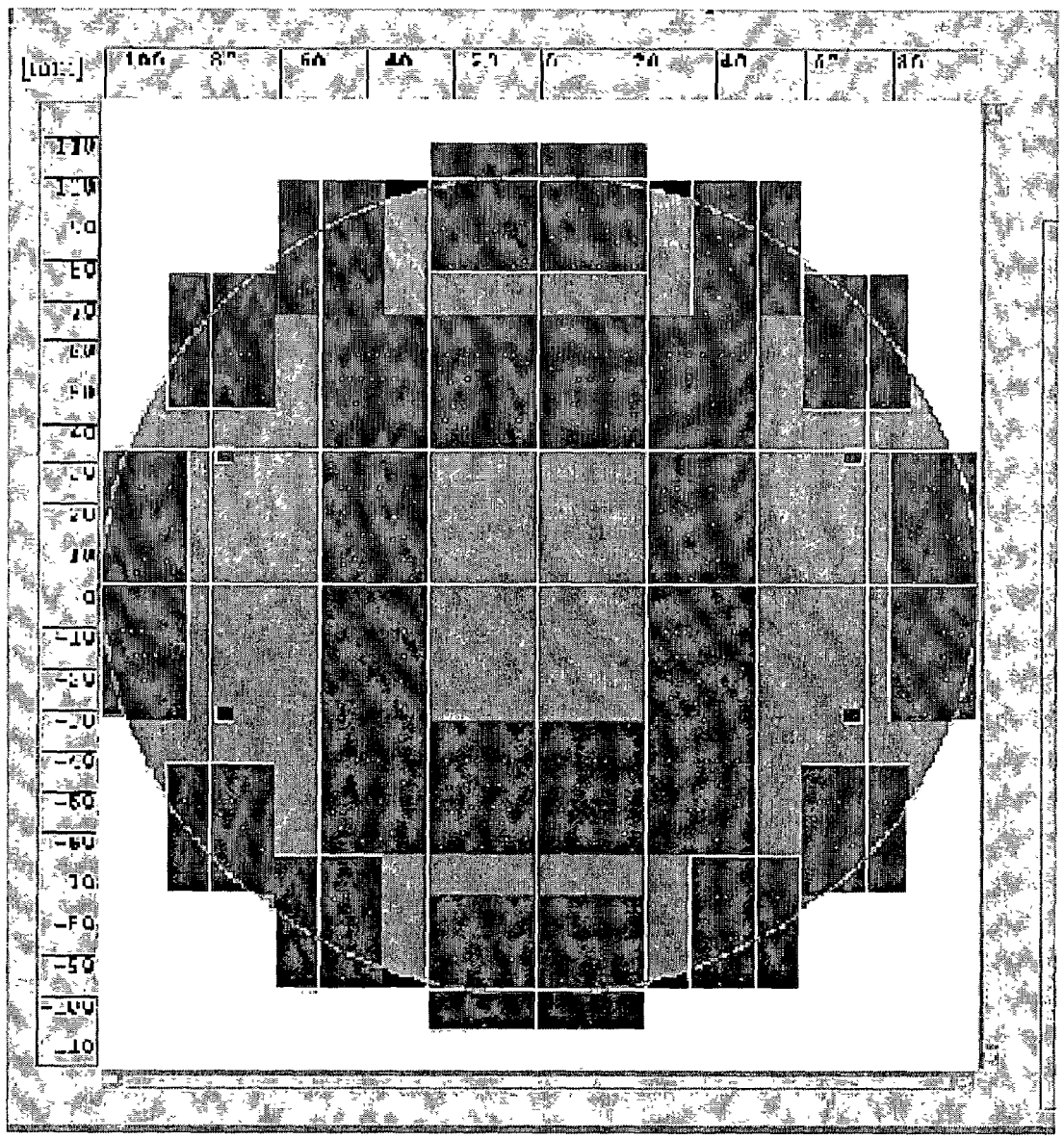
FIG. 2 shows an alternative wafer map of test mark locations.

The test marks can further be used to simulate production-type exposure (e.g., no micro-stepping through focus and alternating scan directions) to measure critical dimension response across the entire surface of the wafer. It is assumed that with improvements in focus there should be improvements in critical dimension control within the shot, across the wafer and from wafer to wafer. In this embodiment, the same fifteen fields with fifteen test marks in each field as described with respect to FIG. 1 are used, but the test marks are formed by alternating exposures in the interior and edge of the wafer, as illustrated in FIG. 2. Altogether there are 16 edge shots and 12 internal shots in this method of using the test marks.

The measured test mark critical dimensions can be grouped in several ways, including the average value (wafer to wafer for each point on the wafer), the value of the interior vs edge of the wafer, plus and minus scans compared to each other, or comparing plus and minus differences in critical dimensions between the edge die scan OFF and scan ON critical dimension.

FIG. 3 is a chart of the results of the optimization testing using the test marks. Focus determination was based upon an astigmatism measurement for 12 wafers with 3 fields per wafer and 15 test mark arrays within each field. All fields and wafers grouped together provided a sample size of 36. The leveling angle determinations were executed upon each of the three fields on the wafer and grouped per wafer for each of the wafers exposed, giving a sample size of 12.

Astigmatism was chosen as a metric to determine best focus measurement metrology as the vertical and horizontal features of the test marks are located next to one another on the reticle used to image the test marks. This eliminates wafer flatness effects on the measurement of the critical dimension. The astigmatism signature across a field is given by the lens, which means that the signature should not change across a wafer, from wafer to wafer or from test mark to test mark.

Experimental data was collected using an NSR S 203B system with lens NA 0.68/0.75 sigma and UV 110 resist. Nikon Self Measurement Process/Program marks of 0.25 microns feature size and test marks with a 0.175 microns feature size were evaluated. To ensure a sufficient sample size, twelve wafers were exposed using each test method. Each test wafer consisted of measurements of three fields per wafer with fifteen points per field evaluating the vertical and horizontal feature best focus. The fifteen measurement points were located with three points across the exposure slit (x direction) and five rows in the exposure scanning direction (y direction). An astigmatism value was calculated for each of the fifteen points on each of the fields for each of the wafers. The astigmatism values were then averaged to obtain an overall value for that feature.

The average value for the test marks using this optimization test was 0.009 $\mu$m, as compared with 0.021 $\mu$m when a Self Measurement Process/Program was used. The leveling angle determination showed a 0.5 $\mu$rad improvement with test marks as compared with Self Measurement Process/Program marks. Test marks using 0.175 $\mu$m features gave improved repeatability as compared to Self Measurement Process/Program marks.

Analysis of this data determines the actual components that cause focus variations. Further tests and analysis characterize critical dimension response across the wafer, as well as wafer to wafer critical dimension variability using the arrays of test marks. This critical dimension data allows for an improved ability to evaluate focus repeatability, as measurement of that variable occurs at a fixed focus. Improvements in focus performance typically results in improved critical dimension control. Finally, using arrays of test marks with a fixed focus mimics production exposure conditions and uses similar measurement techniques to those used to determine the best focus position.

The ability to measure the focus on the wafer accurately is crucial to understanding the causes and components of focus variation and is also critical in demonstrating modifications to these variables that correct for the noted focus detractors. The ideal test mark requires the best possible repeatability value, a decent throughput for measurement and exposure and the ability to detect or compensate for the effects of wafer topography.

As noted for the arrays of test marks shown in FIGS. 1 and 2, the test marks are used to measure the focus and critical dimension response across the entire surface of the wafer. The isolated line that the test marks generate is superior to special test structures that were previously used to measure best focus. Certain types of lens aberrations (spherical aberration, etc.) cause focus differences among different pattern types and sizes. The test marks used herein represent a production realistic pattern which can be used with wafer processing technology with critical dimension sizes less than 150 nm. The length or area of the test marks can be measured and this measurement correlates directly with the actual printed critical dimension size.

The arrays of test marks are created across the surface of the wafer to characterize the focus variations across the wafer. Analysis of the across wafer data permits determination of the magnitude of various focus components and their impact on across wafer performance can be assessed. Further analysis of the critical dimension response across the wafer, and critical dimension response from one wafer to another, serves to verify the analysis of the original focus data. The present invention's measure of focus better characterizes the repeatability of the focus system as it involves more direct numerous measurements of the test marks and less averaging of data points. As the critical dimension testing occurs with production equipment, the evaluation of the focus performance is directly related to the actual performance of the equipment in the field.

In another embodiment of the present invention, arrays of test marks were created and imaged to characterize the across wafer focus response. The same array of test marks shown in FIG. 1 was used in this embodiment. The vertical and horizontal average was taken as input for each measurement location, which eliminates astigmatism from the calculation of cross wafer focus variation. The focus values were then entered into the table shown in FIG. 4, which enabled data analysis to characterize the focus components. Analysis of the focus data along with field and point locations was used to calculate an X tilt and Z focus for each row (five rows per exposure field with three locations across the slot in the X direction).

Figures 5, 6:
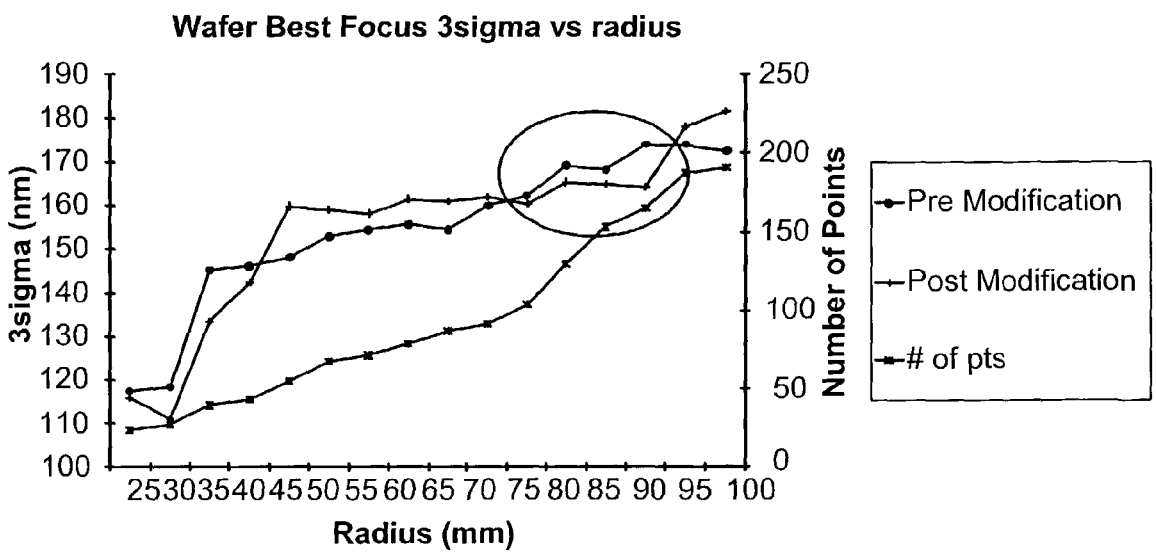
FIG. 5 is a chart of the present invention's through focus systematic focus variation findings.
FIG. 6 is a plot of a wafer's best focus values obtained using the present invention both before and after the equipment used to create the test marks was modified according to data provided by the test marks.

Each result from this test mark through focus test comprised taking the average from the data obtained from three wafers. The focus variation components were calculated from the data set and an average of these components across the three wafers calculated, as is shown in FIG. 4. The wafer-to-wafer value was then calculated as a measure of the repeatability of any of the given test components. This analysis was meant to determine systematic focus factors and how they affect the Total Focus Deviation on any given wafer. FIG. 5 is a table summarizing the results of one application of this analysis.

The following focus components were evaluated: curvature, within shot (Z tracking), within wafer (Z average), within shot (X tilt), within wafer (X tilt), plus versus minus, edge shot OFF and edge shot ON. The curvature was calculated based on the average in the scan direction of the interior shots. Within shot (Z tracking) is the amount of Z focus error within a shot for each measured row. This is essentially a measure of the average Y tilt plus its residuals in range form, calculated from the interior shots. The within wafer (Z average) is the range of best focus values for interior shots based on shot average Z offsets. Within shot (X tilt) is the amount of focus error due to the variation in X tilt for each row within a shot, again taken from the interior shots. The within wafer (X tilt) is the amount of variation due to the average X tilt per shot for interior shots. The plus versus minus component is calculated from subtracting the average of the two interior shots scanned in the plus direction and the two interior shots scanned in the minus direction. For that data, the X tilt and Z position per row worst case mismatch are reported. Edge shot OFF is calculated by taking the average of the fields scanned off of the wafer (one plus and one minus) as compared to the average of the interior plus and minus only shots. The X tilt and Z component are summed to calculate a maximum error. The edge shot ON is the difference between the average edge shot ON fields compared to the edge shot OFF fields.

The data was plotted as a value of the best focus values grouped by wafer radius. The overall focus variation across the wafer, as well as the location of that variation based upon the wafer position was determined. This data was collected mainly to determine the impact of a modification to the lithographic tool that should have improved the focus variation across the wafer. FIG. 6 is a graph illustrating the results of the pre- and post-testing of this modification. The described arrays of test marks enabled this type of data collection. The results showed an improvement in focus repeatability at the wafer radius of 75 to 90 mm, as well as the fact that focus variation in that range was equivalent to that of the interior of the wafer. The pre-modification data shows that focus variation degraded starting at the 75 mm wafer radius.

Two methods were used to analyze the critical dimension testing method's results. The first technique grouped the critical dimension data into systematic groupings of shot combinations and was evaluated based upon a value of the measured critical dimensions. The layout produced critical dimensions for edge and interior (non-edge) shots as well as plus and minus scan directions. Data was collected pre- and post-modification to compare across wafer focusing. FIG. 7 is a table of the resultant data.

The results show improvement in nearly all categories following the modification. The critical dimension measurements were a clear indicator of the improvements of critical dimension control on the wafer after the modification. This critical dimension data supported the expected across wafer focus improvement, especially from the improved critical dimension values at the edge of the wafer. The data shows the edge only cross wafer in OCD $\mu$m range from averaged fields/wafer dropped from 0.887 $\mu$m to 0.278 $\mu$m.

A second method of analysis for the critical dimension data was evaluation of the critical dimension measurements that occurred at the edge of the wafer. The modification should have improved focus control at the very edge of the wafer, but the prior method of data collection did not clearly show this. Alternative analysis of the critical dimension data was required. In the case of a line printed significantly out of focus, the arrays of test marks of the present invention would register a blank, indicating no critical dimensions were present. Thus, if the data were examined to compare the presence versus absence of a measured critical dimension, it could be used to indicate an improvement in focus control, compared to no critical dimension measurement. There were ten wafers exposed for each condition in which critical dimensions were judged as either measured on none of the wafers, measured on some of the wafers or measured on all of the wafers. FIG. 8 illustrates these results.

As shown in FIG. 8, post-modification there are significantly more sites that had critical dimension present than were found in the pre-modification wafers. This type of critical dimension analysis allowed for visual confirmation that focus control and focus repeatability were improved by the modification. Following the modification, more sites had successfully imaged features which were measurable using the arrays of test marks.

Multiple tests have demonstrated that the arrays of test marks provide an accurate and repeatable measurement tool for determining both best focus and critical dimensions. The described arrays of test marks have demonstrated good repeatability when using the methods described herein for measuring best focus, with an average value of 9 nm. This accuracy is excellent based on most currently employed focus control limits. The test mark arrays also offer good throughput, requiring approximately 20 minutes to measure one fifteen-point field. Test mark arrays provide the ability to average over multiple fields or wafers, as necessary. Exposure of the wafers to create the arrays of test marks and the time required to measure the critical dimensions of the test marks for best focus determination requires a comparable amount of time to other photo test methods.

Throughput, without compromising repeatability, is one aspect that defines the test methods using arrays of test marks described herein. In one example, when evaluating best focus values using micro-stepped arrays of test marks, 17 fields with 219 points on the wafer were exposed and measured in about 2 hours. In another example, the critical dimension results on twelve interior fields and sixteen edge fields, totaling nearly 325 CD sites on the wafer, were exposed and measured in only 40 minutes. This type, volume and accuracy of data enabled determination of focus improvements in a specific region of the wafer yielding an improvement in focus accuracy of roughly a 10 nm over a 15 mm radial span on the wafer. It also allows for a quick estimation of the factors affecting focus variation across the wafer and provides insights as to what aspects of scanner focus control can be improved.

Using an automated critical dimension-SEM program, under reasonable conditions, measurements similar to those described in the preceding paragraph would have required nearly five hours. The present invention also allowed for multiple wafer averaging which provided some key insights into methods for improved edge focus response. SEM technology and methods would not have permitted this type of data collection.

The test mark pattern illustrated in FIG. 1 can also be used to evaluate intra and/or inter-wafer critical dimension variations during wafer fabrication. In these applications, it is generally not necessary to provide an array of test marks at each location. Rather one, two or a small number of test mark in each test field typically is sufficient. In production wafers it becomes important to position the test marks at unobtrusively on unused portions of the wafer and/or integrated circuit chip patterns. For example, the regions of the wafers that correspond to the scribe lines that separate adjacent integrated circuits are typically sacrificed (i.e., they are typically cut along during singulation) and can provide good locations for test marks. Similarly, regions between different component blocks within an integrated circuit often have spaces large enough to accommodate the described test marks. Additionally, when extended, parallel conductors are provided, the spaces between the parallel lines can often be used to accommodate the test marks, with very little, if any, impact on the integrated circuit design. Further, areas near the periphery of the wafer outside the areas dedicated to the formation of integrated circuits are well suited for accommodating test marks.

While embodiments of the present invention have been shown and described, it will be apparent to those skilled in the art that changes and modifications to these illustrative embodiments can be made without departing from the present invention in its broader aspects. Thus it should be evident that there are other embodiments of this invention which, although not expressly described above, are within the scope and spirit of the present invention. For example, the test mark arrays and the methods for analyzing them described herein can be used to evaluate etch processing steps and their reproducibility in a similar manner to that shown for their use in determining best focus. The exact number of test mark arrays and the exact choice of fields can be varied as the optical test equipment used to measure the test marks either become less expensive or more automated. As mentioned earlier, test mark length is measured in some embodiments of the present invention, and in others the area of the test marks is measured and used for the different analyses performed on that data. Given these variations, it will be understood that the appended claims necessarily encompass all such changes and modifications as fall within the described invention's true scope and spirit. Further, that this scope and spirit is not limited merely to the illustrative embodiments presented to demonstrate that scope and spirit.

Although only a few embodiments of the present invention have been described in detail, it should be understood that the present invention may be embodied in many other specific forms without departing from the spirit or scope of the invention. The present invention has been described primarily in the context of evaluating semiconductor wafers used in the formation of integrated circuits. However, it should be appreciated that the described techniques can be applied to the evaluation of best focus and/or critical dimension variations in other lithography based processes including, for example, the manufacture of biometric micro-arrays, MEMS (Micro-Electro-Mechanical Systems), etc.

The exact number of test field arrays, the number of samples within each field, and the exact locations of the fields can be varied in accordance with the needs of a particular system. As the optical test equipment used to measure the test marks become less expensive and/or more automated, it is likely that it may be desirable to add even more fields. In the primary described embodiments, either the length or the area of the test marks is measured and used for the different analyses performed on that data. However, it should be appreciated that in other applications, it may be desirable to measure a slightly different geometric parameter. By way of example, in some situations it may be possible to measure the area of just a portion of the test marks. The sensors used to detect the length, area or other geometric aspect of the test marks may also be widely varied. In some production related applications it will be desirable to pull the wafers to be tested from the production line for inspection. In other production related applications it will be desirable to incorporate the sensors directly into the manufacturing equipment so that the measurements can be made without requiring removal of the inspected wafers from the normal production path.

As pointed out above, one critical dimension of interest in semiconductor fabrication tends to be interconnect line width. However, the same techniques can be used to evaluate any critical dimensions of interest, including non-linear features in a resist or other layers in semiconductor devices, features in biometric micro-arrays, MEMs, etc.

As alluded to above, the described methodology can be useful at a number of different stages in the development and production cycle. For example, the described methodology may be useful during the characterization of lithographic and etch processes, during calibration of such processes or the equipment used to perform such processes, during the calibration of the sensing tool, and/or during actual manufacturing of integrated circuits or other structures. During actual manufacturing, the methodology can be used once or numerous times during the manufacture of a single wafer or it can be used on a given number of sample wafers during each production run or any combination of these methods and applications.

The invention has been primarily described in the context of embodiments that define the test marks by partially exposing a pair of overlapping straight line segments in a resist layer wherein the lines have widths that are equal to a critical dimension of interest. Although these embodiments are preferred in most applications due to their simplicity, it should be appreciate that the overlapping lines do not necessarily need to be straight, and the line widths do not necessarily need to be equal to the critical dimension of interest.

Additionally, as suggested above, the appropriate lithographic exposure doses used to activate the resist will depend in great part on the nature of the resist being used. It should be apparent that the test marks can be formed in either positive or negative resists. Therefore, the present examples are to be considered as illustrative and not restrictive, and the invention is not to be limited to the details given herein, but may be modified within the scope of the appended claims.

What is claimed is:

1. A method comprising:
   repeatedly exposing a wafer with a lithography tool to form a plurality of test fields on the surface of the wafer, each test field including a plurality of test marks;
   measuring a characteristic of the test marks;
   determining a focus characteristic associated with each test field based at least in part on the measured characteristics;
   mapping the wafer based on the determined focus characteristics, whereby the mapping may demonstrate variations in the determined focus characteristics across the wafer;
   characterizing the lithography tool based on the mapped wafer to account for any determined focus characteristic variations of interest; and
   adjusting the lithography tool to improve focusing based on the characterization.

2. The method of claim 1, wherein the determined focus component comprises one of the following:
   curvature within one of the test fields;
   curvature across the wafer;
   tilt within one of the test fields;
   tilt across the wafer;
   variation of tilt and focus along the scanning direction of the lithography tool; and
   comparison of the scanning of selected test marks on the wafer versus the scanning of second test marks off the wafer.

3. The method of claim 1, wherein the test fields are formed at various location around the periphery of the wafer and the interior regions of the wafer.

4. The method of claim 1, wherein each of the test marks comprises a pair of angularly offset overlapping exposure lines having a width substantially equal to a critical dimension of interest.

5. The method of claim 1, wherein the test field pattern is formed by scanning in one of the following directions;
   the plus only direction;
   the minus only direction; or
   the plus and minus direction.

6. A method for determining the performance of semiconductor wafer processing equipment, the method comprising:
   creating a plurality of test fields on the surface of the semiconductor wafer during a processing step, each test field including a plurality of test marks, the test marks being made by an imaging pattern with known critical dimensions;
   measuring the test marks after the processing step is complete, wherein the measurements are indicative of a critical dimension;
   determining a characteristic associated with each test field based at least in part on the measured test marks, wherein the determined characteristics facilitate mapping the wafer in a manner that may demonstrate variations in the determined characteristics across the wafer; and
   adjusting the equipment if the test marks are not measured to have at least a predefined value, wherein the adjustments are made in a manner that is capable of accounting for variations that occur across the wafer.

7. The method of claim 6 wherein the test marks are created on scribe lines which denote the boundary between the plurality of active semiconductor dies being fabricated on the semiconductor wafer.

8. The method of claim 6 wherein the plurality of test fields comprises a plurality of matrices of test marks, at least some of the matrices being created on interior areas of the semiconductor wafer and at least some of the matrices being created on the outer edge of the semiconductor wafer.

9. The method of claim 6 wherein an optical scanning device measures a length of the test marks, the equipment being adjusted if the length measured is not at least as great as a first predefined length.

10. The method of claim 6 wherein an optical scanning device measures the area of the test marks, the equipment being adjusted if the area measured is not at least as great as a first predefined area.

11. The method of claim 6 wherein the test marks are placed on production semiconductor wafers.

12. The method of claim 6 wherein the test marks are placed on test semiconductor wafers.

13. A method as recited in claim 6 wherein the test marks are created on areas of the semiconductor wafer that will not be part of functional finished semiconductor devices.

14. A method for using test marks generated by a lithographic process, the method comprising the steps of:
   selecting a plurality of areas of a semiconductor wafer upon which test marks will be generated;
   generating a test field in each of the selected areas by using a lithographic process, each test filed including a plurality of test marks;
   measuring at least a first predefined parameter of the test marks;
   determining a characteristic associated with each test field based at least in part on the measured test marks, wherein the determined characteristics facilitate mapping the wafer in a manner that may demonstrate variations across the wafer; and altering at least one parameter of the lithographic process depending on the results of the measuring step in a manner that compensates for variations that occur across the wafer.

15. The method of claim 14 wherein the first predefined parameter of the test marks is the length of the test marks.

16. The method of claim 14 wherein the first predefined parameter of the test marks is the area of the test marks.

17. The method of claim 14, wherein the areas selected on the semiconductor wafer include the scribe lines, the scribe lines being cut when the wafer is diced.

18. The method of claim 14 wherein the parameter of the lithographic process being altered is the focus of the lithographic process.

19. The method of claim 14 wherein the test marks within each test field are generated as a matrix of test marks.

20. A method for determining the best focus position of a lithographic production device, the method comprising the steps of:

creating a plurality of test fields in a resist, wherein each test field has a multiplicity of test marks that are stepped through focus;

measuring each of the test marks, thereby generating test mark data;

using the test mark data to select a best focus profile for future operation of the lithographic production device that created test marks wherein the best focus profile accounts for variations in the best focus that occur across the wafer.

21. The method of claim 20 wherein the area of the test marks is measured to generate the test mark data.

22. The method of claim 20 wherein the length of the test marks is measured to generate the test mark data.

23. The method of claim 20 wherein the test fields are created on a test wafer prior to using the lithographic device to produce a production wafer.

24. The method of claim 20 wherein the test fields are created on production wafers selected on a predefined schedule, the test mark data from test field on production wafers being used to adjust the focus of the lithographic production device during manufacturing operations.

25. A method for determining the best focus position of a lithographic production device, the method comprising the steps of:

creating a plurality of test marks across a surface of a wafer at a first focus position;

stepping the focus position to a successive focus position;

repeating the creating and stepping operations until a plurality of test marks has been created on the wafer at a predefined plurality of focus steps, the plurality of test marks being arranged in a plurality of test fields that are distributed at different locations across the wafer;

measuring each of the test marks; and selecting the a focus profile step for future operation of the lithographic production device that created test marks based at least in part on the test marks in each test field having the largest measure value, wherein the focus profile accounts for variation in focus that occur across the wafer.

26. The method of claim 25 wherein an optical apparatus measures the length of the test marks and the selected focus step creates the longest measured test mark.

27. The method of claim 25 wherein an optical apparatus measures the area of the test marks and the selected focus step creates the largest measured test mark.

28. The method of claim 25 wherein each test field comprises an array of test marks.

29. The method of claim 28 wherein each array of test marks comprises a 3×5 rectangular matrix of test marks.

30. The method of claim 25 wherein a scanning apparatus creates the test marks and further wherein at least some of the test marks are created on an outer edge of the wafer as the scanning apparatus scans from across the surface of the wafer to a position where the scanner is not over the wafer and at least some of the test marks are created on an outer edge of the wafer as the scanning apparatus scans from a position where the scanner is not over the wafer to a position where the scanner scans across the surface of the wafer.

* * * * *

UNITED STATES PATENT AND TRADEMARK OFFICE
CERTIFICATE OF CORRECTION

PATENT NO. : 6,974,653 B2 Page 1 of 1
APPLICATION NO. : 10/310640
DATED : December 13, 2005
INVENTOR(S) : Leung et al.

It is certified that error appears in the above-identified patent and that said Letters Patent is hereby corrected as shown below:

In the Title Page:

In "Foreign Patent Documents" section, change "EP 4-324615" to --JP 4-324615--.

In the Claims:
(column 14, line 15) delete first instance of "the".
(column 14, line 15) delete "step".

Signed and Sealed this

Twenty-fifth Day of July, 2006

JON W. DUDAS
*Director of the United States Patent and Trademark Office*